United States Patent [19]
Miller et al.

[11] Patent Number: 5,406,633
[45] Date of Patent: Apr. 11, 1995

[54] HEARING AID WITH PERMANENTLY ADJUSTED FREQUENCY RESPONSE

[75] Inventors: Kenneth R. Miller, Macedon; Lynn F. Fuller, Canandaigua; James C. Taylor, Rush; Robert D. Frisina, Penfield; Joseph P. Walton, Fairport, all of N.Y.

[73] Assignee: Auditory System Technologies, Inc., Pittsford, N.Y.

[21] Appl. No.: 970,628

[22] Filed: Nov. 3, 1992

[51] Int. Cl.$^6$ .......................................... H04R 25/00
[52] U.S. Cl. ................................. 381/68.4; 381/68; 381/68.2
[58] Field of Search ..................... 381/68, 104, 71, 94, 381/68.2, 68.4, 69

[56] References Cited

U.S. PATENT DOCUMENTS

| | | |
|---|---|---|
| 3,209,083 | 9/1965 | Posen . |
| 3,764,745 | 10/1973 | Bottcher et al. . |
| 3,792,367 | 2/1974 | Fleischer et al. . |
| 3,920,931 | 11/1957 | Yanick, Jr. . |
| 3,927,279 | 12/1975 | Nakamura et al. . |
| 4,025,721 | 5/1977 | Graupe et al. . |
| 4,061,875 | 12/1977 | Freifeld et al. . |
| 4,119,814 | 10/1978 | Harless . |
| 4,405,831 | 9/1983 | Michelson . |
| 4,490,585 | 12/1984 | Tanaka . |
| 4,718,094 | 1/1988 | Hotvet . |
| 4,750,207 | 6/1988 | Gebert et al. . |
| 4,792,977 | 12/1988 | Anderson et al. .......... 381/68 |
| 4,837,832 | 6/1989 | Fanshel . |
| 5,001,441 | 3/1991 | Gen-Kuong . |
| 5,263,089 | 11/1993 | Ribic ....................... 381/68.2 |

FOREIGN PATENT DOCUMENTS

| | | |
|---|---|---|
| 2353696 | 5/1975 | Germany . |
| 8302862 | 8/1983 | WIPO . |

OTHER PUBLICATIONS

"Active Filter Cookbook", Don Lancaster, pp. 53-55 and 60, 62. Copyright 1975 by Howard W. Sams & Co., Inc.

"Designing with the Adaptive High Pass Filter", Gennum Corporation, Oct. 1989.

"Sound Field Audiometry and Hearing Aid Selection", pp. 204-207, *Hearing Instrument Selection and Evaluation*, Ernest Zelnick, Editor, published by Natl. Institute for Hearing Instruments Studies.

"Review of Suggested Hearing Aid Procedures," pp. 20-25, I bid.

"*Hearing Aid Assessment and Use in Audiologic Habilitation*", Wm. R. Hodgson, Ed., publ. by Wms. & Wilkins; Chapters 5 (pp. 109-125) & 6 (pp. 128-141).

"Active Filter Design Using Operational Transconductance Amplifiers: A Tutorial", by R. H. Geiger & E. Sanchez-Sinercio, pp. 20-32, *IEEE Circuits and Devices*.

"Classifying automatic signal processors," in Hearing Instruments, vol. 41, No. 8, 1990 (Reprint).

"The National Acoustic Laboratories' (NAL) New Procedure for Selecting the Gain and Frequency Response of a Hearing Aid," Denis Byrne & Harrey Dillon, in Ear and Hearing, The Williams & Wilkins Co., 1986.

*Primary Examiner*—Curtis Kuntz
*Assistant Examiner*—Sinh Tran
*Attorney, Agent, or Firm*—Eugene Stephens & Associates

[57] ABSTRACT

A hearing aid is permanently adjusted to match prescribed amplification characteristics at predetermined frequencies. A single channel filter (24) includes three identical filter stages (60, 62, and 64) that are optionally cascaded in series. Each of the filter stages (60, 62, and 64) exhibits a frequency response curve having a first corner frequency (36) below which the magnitude of the response curve approaches a predetermined minimum value, a second corner frequency (38) above which the magnitude of the response curve approaches a maximum value, and a predetermined gain in magnitude between the minimum and maximum values.

19 Claims, 4 Drawing Sheets

HEARING AID WITH PERMANENTLY ADJUSTED FREQUENCY RESPONSE

TECHNICAL FIELD

Our invention relates to hearing aids that are prescribed for matching patterns of hearing impairment with desired amplification characteristics.

BACKGROUND

Hearing aids help to compensate for a wide range of hearing impairments that vary in magnitude from mild to severe based on amounts of amplification required to meet hearing threshold levels at predetermined frequencies. Individual patterns of hearing impairment are plotted in audiograms that record a range of hearing threshold levels over a domain of audible frequencies.

Detailed audiological assessments of hearing performance are made by measuring the hearing threshold levels throughout the range of audible frequencies presented as both pure tones and speech. Other measures include air and bone conduction, reflexes, tympanometry, most comfortable loudness level (MCL), loudness discomfort level (LDL), and real-ear unaided response (REUR)—the acoustical influence of the auditory canal and concha.

Various combinations of these measures are used in conjunction with a variety of prescriptive formulae for selecting hearing aid amplification characteristics. For example, one prescriptive formula, known as the Byrne and Tonisson procedure, calculates amplification characteristics required to present important frequency components of speech with equal loudness. Another prescriptive formula, known as the Berger procedure, calculates amplification characteristics required to restore a fraction close to one-half of the measured hearing loss at each frequency.

The prescriptive formulae specify exact amplification characteristics at predetermined frequencies, and these desired characteristics are often referred to as "target frequency responses". However, the ability to meet these target frequency responses with known hearing aids is limited, and procedures for selecting and adjusting hearing aids to approximate the target frequency responses are much less exacting.

One approach allows physicians and audiologists to choose from a large array of electrical components such as microphones, amplifiers, filters, and receivers, each contributing to a total frequency response of the assembled hearing aid. The large number of available components, peculiarities of each component, and the interaction between components make the choice of a complete set of components very difficult and time consuming. The large number of different components also adds considerable inventory, design, and manufacturing costs.

Another approach provides physicians and audiologists with a matrix of frequency responses from which to choose. The electrical components for achieving the target frequency responses are selected in advance by the hearing aid manufacturers. However, the limited choices for frequency response usually preclude a close match with the target frequency response, and the hearing aid performance is correspondingly reduced. Improperly matched hearing aids can also produce distorted or uncomfortable sounds and can obscure information important to the perception of speech.

The ability to match target frequency responses with known hearing aids is also limited by the performance of filters within the hearing aid circuits. Attempts have been made to combine filters in both series and parallel circuits to more closely match target frequency responses. However, any frequencies that are attenuated by a first filter in a series circuit cannot be fully restored to a higher level of amplification. Filters arranged in parallel (i.e., in separate channels) for processing different portions of the audible spectrum produce individual phase shifts that interfere with recombining the two processed portions of the spectrum.

Some hearing aids are also provided with potentiometers to provide a further adjustment to frequency response after manufacture. The potentiometers are used to control the performance of hearing aid components such as amplifiers and filters. The adjustments are often based on subjective responses of the hearing aid wearer and may produce results that are inappropriate for other sound environments.

SUMMARY OF INVENTION

Our invention simplifies procedures for fitting hearing aids to prescription requirements and provides for more closely matching a broad range of prescription requirements with a single set of components. The prescription requirements are fit during manufacture of our hearing aid. This allows physicians and audiologists to specify desired performance characteristics without regard for hearing aid manufacturing considerations.

Our hearing aid incorporates conventional components including a microphone, an amplifier, and a receiver. These components, including a shell for in-the-ear (ITE) hearing aids, preferably exhibit a combined frequency response similar to a conventional prescription fit for no hearing loss. Within the hearing aid, the frequency response is represented by an audio signal with an amplitude that varies as a function of frequency.

A single channel filter provides for varying the frequency response to match predetermined patterns of hearing loss. The filter exhibits a response curve having (a) a first corner frequency below which the magnitude of the audio signal approaches one of a predetermined minimum and maximum values, (b) a second corner frequency above which the magnitude of the audio signal approaches the other of the predetermined minimum and maximum values, and (c) a desired gain in magnitude between the minimum and maximum values. The first and second corner frequencies, along with the desired gain, are set to match the predetermined pattern of hearing loss.

The filter is implemented with a plurality of identical filter stages that are optionally cascaded in series. Preferably, each of the filter stages is a biquadratic filter structure defined by a transfer function having two independently adjustable corner frequencies (i.e., "zero" and "pole" frequencies of the transfer function). A roll-off rate (i.e., a slope of the response curve) between the two corner frequencies is determined by the number of filter stages that are cascaded in series.

Together, the conventional hearing aid components and the single channel filter exhibit a total frequency response that closely matches prescription requirements for the hearing aid. The single channel filter can also be adjusted to compensate for different prescriptive formulae and for variations in the frequency response of particular components.

DRAWINGS

DETAILED DESCRIPTION

Figure 1:
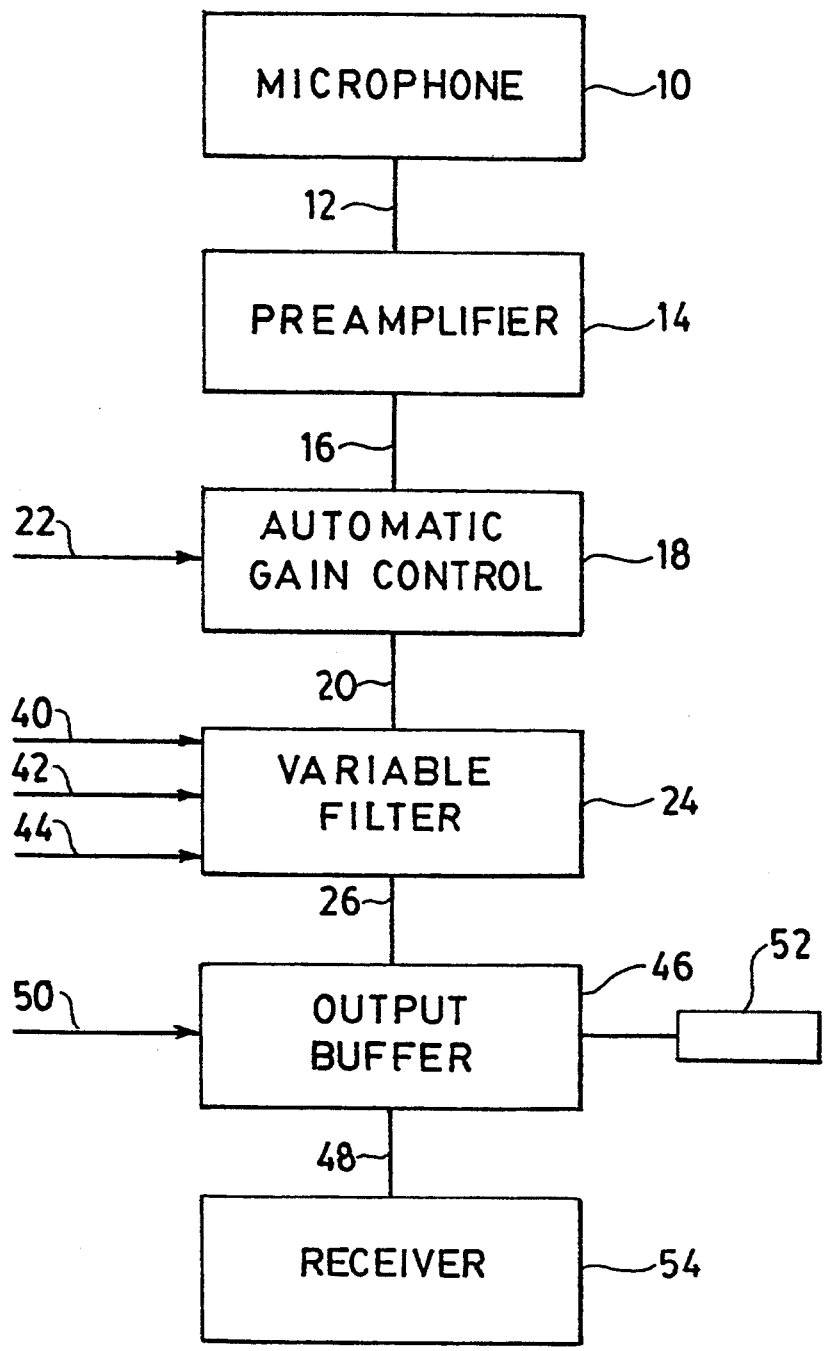
FIG. 1 is a block diagram of our hearing aid circuit depicting a preferred arrangement of components that are used for carrying out our invention.

Our hearing aid is preferably constructed as an in-the-ear (ITE) hearing aid having components including a microelectronic chip mounted within a shell that is molded to fit within a patient's external ear or concha. The microelectronic chip forms the core of a hearing aid circuit shown as a block diagram in FIG. 1.

A microphone 10 converts sound waves into an audio signal 12. A preamplifier 14 receives the audio signal 12 and outputs an audio signal 16 that is increased in magnitude. Preferably, the audio signal 16 reflects a gain of about 18 decibels over the audio signal 12.

An automatic gain control circuit 18 receives the preamplified audio signal 16 and outputs an audio signal 20 that is limited in magnitude by a threshold setting 22. Normally, the audio signal 20 reflects a predetermined gain (preferably about 14 decibels) over the input audio signal 16. However, the predetermined gain of the automatic gain control circuit 18 is reduced for input signals above the threshold setting 22. Still higher input levels are compressed to limit the magnitude of the audio signal 20 in accordance with a prescribed loudness discomfort level (LDL).

Figure 2:
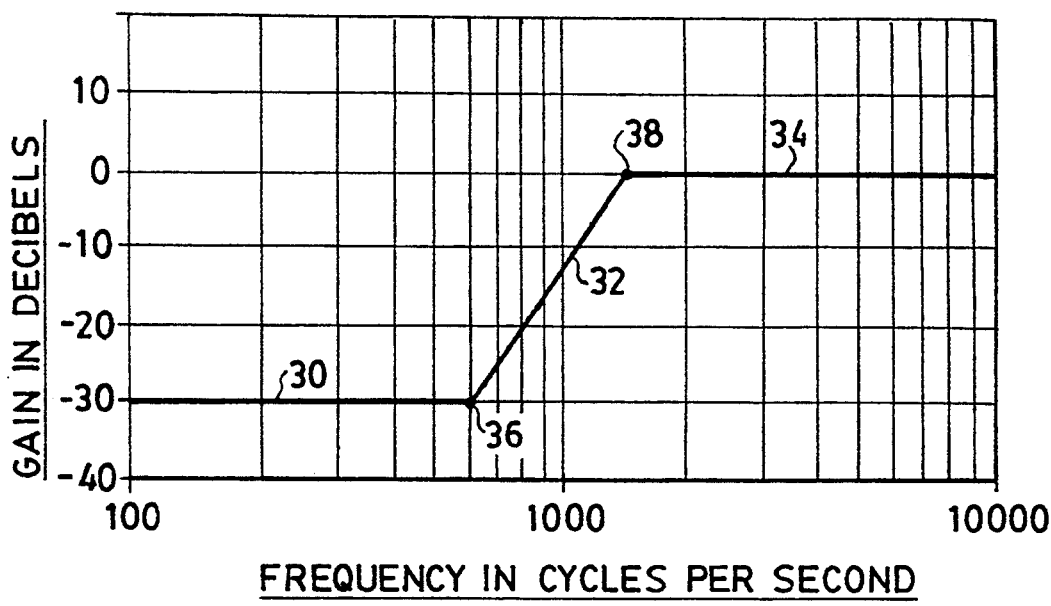
FIG. 2 is a graph depicting a simplified asymptotic representation of a response curve exhibited by a state variable filter that is included among the components depicted in FIG. 1.

A state variable filter 24 receives the gain-controlled audio signal 20 and outputs an audio signal 26 that is varied in magnitude as a function of frequency. FIG. 2 depicts a response curve of the state variable filter 24 in a simplified form as a piecewise curve composed of three interconnected asymptotes 30, 32, and 34 of the actual response curve. The curve also includes two corner frequencies 36 and 38 formed by intersections of the three asymptotes.

The filter response curve exhibits a flat frequency response below the corner frequency 36 approaching a predetermined minimum value (e.g., $-30$ decibels), a sloped frequency response between the corner frequencies 36 and 38, and a flat frequency response above the corner frequency 38 approaching a predetermined maximum value (e.g., 0 decibels). A difference in gain "G" in decibels between the two corner frequencies is determined in accordance with the following equation:

$$G = 20 \log [(W_z^2/W_p^2)^n]$$

where "$W_z$" is the corner frequency 36, "$W_p$" is the corner frequency 38, and "n" is an integer. The magnitude of the gain "G" is preferably limited to between $-45$ decibels and 9 decibels. The magnitude of "$W_p$" of corner frequency 38 is preferably limited to between 1250 hertz and 2500 hertz.

The shape of the response curve is controlled by three settings 40, 42, and 44 corresponding to the respective magnitudes "$W_z$" and "$W_p$" of the corner frequencies 36 and 38 and the integer "n" to match patterns of hearing loss with a minimum of variables. The three variables "$W_z$", "$W_p$", and "n" control magnitudes of gain in two different portions of the acoustic spectrum, as well as roll-off rates (i.e., the slope of the response curve) between the two spectrum portions.

Preferably, the magnitudes of "$W_p$", "G", and "n" are prescribed to match patterns of hearing loss. However, the magnitude of "$W_z$" can be readily determined by rewriting the above equation for "G" as follows:

$$W_z = W_p \, 10^{\frac{G}{40\,n}}$$

The preferred limits on the magnitude "$W_p$" of corner frequency 38 and on the resulting difference in gain "G" allow the filter response curve to fit most patterns of hearing loss.

An output buffer 46 receives the filtered audio signal 26 and outputs an audio signal 48 that is adjusted for volume control. A maximum gain of the audio signal 48 over the filtered audio signal 26 is controlled by a maximum volume setting 50. Preferably, the maximum gain is limited to between $-25$ decibels and 15 decibels. An externally adjustable volume control setting 52 provides for reducing the maximum gain of the audio signal 48 in accordance with user preference.

The volume-adjusted audio signal 48 drives a receiver 54 that converts the audio signal 48 into sound waves. Preferably, the receiver 54, like the microphone 10, is of highest quality to accurately reproduce a wide range of frequency responses.

Figure 3:
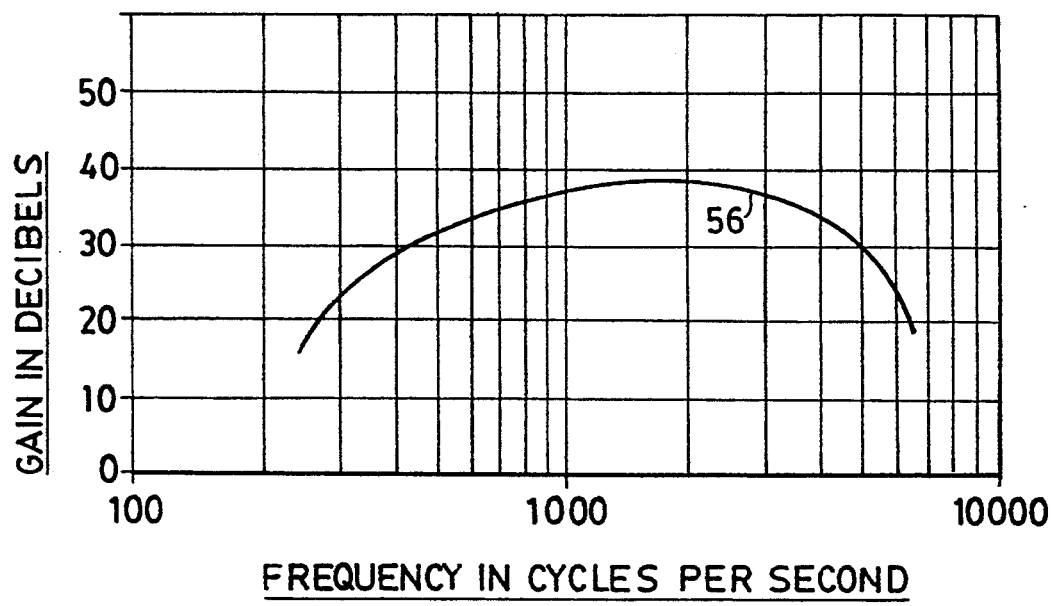
FIG. 3 is a graph depicting an overall shape of a frequency response curve exhibited by the hearing aid components independently of the state variable filter.

The microphone 10, the amplifiers 14, 18, and 46, the receiver 54, and the shell (not shown) preferably produce, independently of the state variable filter 24, a bow-shaped frequency response curve such as the curve 56 shown in FIG. 3. The curve 56 is shaped similar to the frequency response curve of a conventional prescription fit for no hearing loss. This allows the three settings 40, 42, and 44 of the state variable filter to match the overall frequency response of the hearing aid to most patterns of hearing loss.

Figure 4:
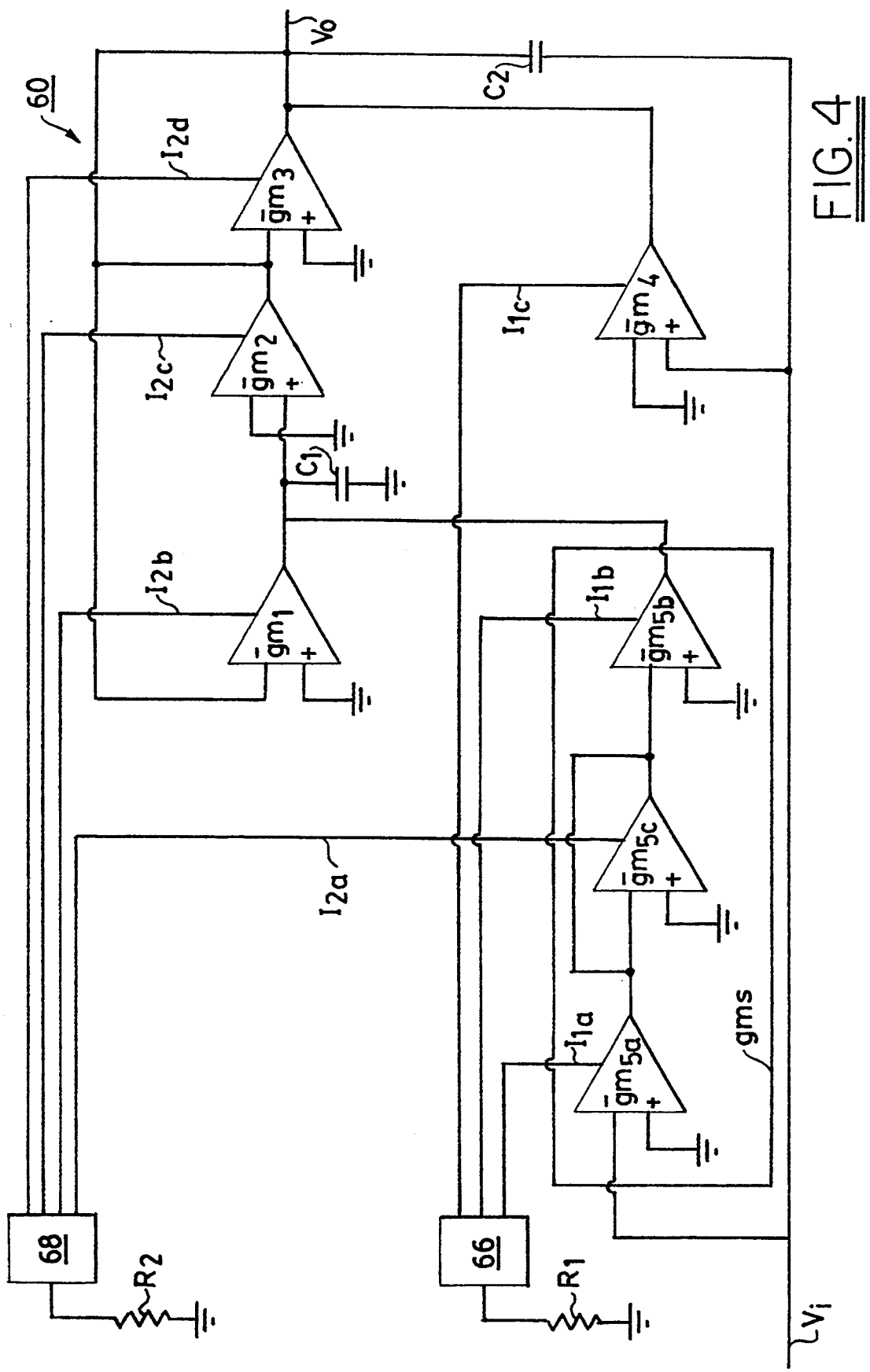
FIG. 4 is a circuit diagram of one of three identical biquadratic filter stages that make up the state variable filter.
Figure 5:
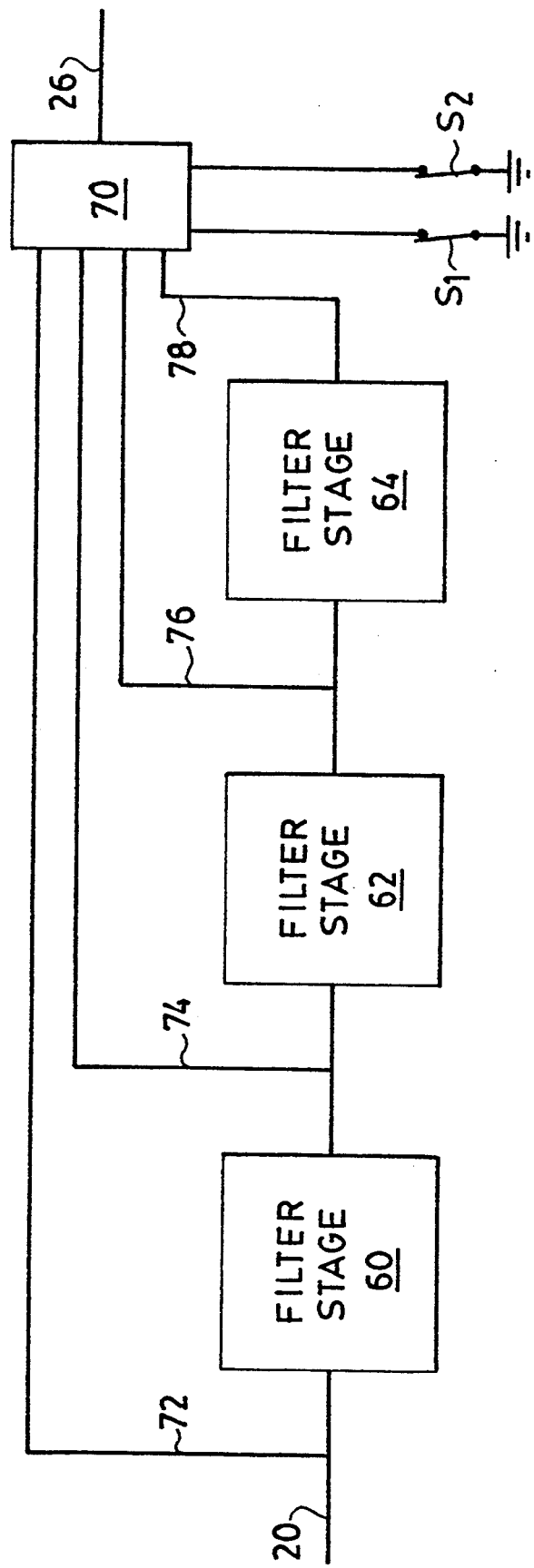
FIG. 5 is another circuit diagram showing how the filter stages are optionally cascaded in series to vary the exponential order of the state variable filter.

The state variable filter 24 is preferably constructed from a series of biquadratic filter stages that are optionally cascaded together within a single channel circuit. FIG. 4 illustrates a particular biquadratic filter stage 60, and FIG. 5 illustrates how this filter stage can be optionally cascaded together with two other identical biquadratic filter stages 62 and 64 for producing a higher order filter.

Each of the biquadratic filter stages exhibits a general transfer function "H(s)" as follows:

$$H(s) = \left[ \frac{s^2 + (W_z/Q_z) + W_z^2}{s^2 + (W_p/Q_p) + W_p^2} \right]$$

where "s" is a complex frequency equal to j [2 pi f] (with "j" being an imaginary number equal to the square root of $-1$, with "pi" being the ratio of the circumference of a circle to its diameter, and with "f" being frequency measured in hertz); "$W_z$" is the corner frequency 36, now representing a "zero" of the transfer function in angular measure; "$W_p$" is the corner frequency 38, now representing a "pole" of the transfer function in angular measure; and "$Q_z$" and "$Q_p$" are referred to as "quality factors" or "inverse dampening factors" of the zero and pole, respectively.

The illustrated biquadratic filter 60 includes seven operational transconductance amplifiers labeled, "$g_{m1}$", "$g_{m2}$", "$g_{m3}$", $g_{m4}$", "$g_{m5a}$", "$g_{m5b}$", "$g_{m5c}$". Each transconductance amplifier includes two inputs that produce a differential voltage. The transconductance gain of each amplifier is multiplied by the differential voltage to produce an output current. Capacitors "$C_1$" and "$C_2$" continuously sum outputs of the transconductance amplifiers.

The output of the filter circuit as a model of the transfer function H(s) is given below:

$$H(s) = \frac{V_o}{V_i} = \frac{(C_1 C_2) s^2 + (C_1 q_{m4}) s + (g_{m2} g_{m5})}{(C_1 C_2) s^2 + (C_1 g_{m3}) s + (g_{m1} g_{m2})}$$

where "$V_o$" and "$V_i$" are the respective output and input voltages shown in FIG. 4; "$C_1$" and "$C_2$" are the respective capacitances of the like-labeled capacitors; "$g_{m1}$", "$g_{m2}$", "$g_{m3}$", and "$g_{m4}$" are the transconductance gains of the amplifiers labeled the same; and "$g_{m5}$" is the effective transconductance gain of the three amplifiers labeled "$g_{m5a}$", "$g_{m5b}$", "$g_{m5c}$" according to the following relationship:

$$g_{m5} = \frac{g_{m5a} g_{m5b}}{g_{m5c}}$$

Relating the particular transfer function of the circuit shown in FIG. 4 to the general transfer function of a biquadratic filter yields the following equations for the corner frequencies "$W_z$" and "$W_p$" and quality factors "$Q_z$" and "$Q_p$":

$$W_z = \frac{(g_{m2} g_{m5})^{0.5}}{(C_1 C_2)^{0.5}}$$

$$W_p = \frac{(g_{m1} g_{m2})^{0.5}}{(C_1 C_2)^{0.5}}$$

$$Q_z = \frac{1}{g_{m4}} \frac{(g_{m2} g_{m5} C_2)^{0.5}}{(C_1)^{0.5}}$$

$$Q_p = \frac{1}{g_{m3}} \frac{(g_{m1} g_{m2} C_2)^{0.5}}{(C_1)^{0.5}}$$

Preferably, all of the amplifiers are identical, and the values of the quality factors "$Q_z$" and "$Q_p$" are set by the capacitances "$C_1$" and "$C_2$" at nominal values of the corner frequencies "$W_z$" and "$W_p$". The values of the quality factors "$Q_z$" and "$Q_p$" are both preferably set at approximately 0.707 to provide for a maximum change in curvature at the corner frequencies without producing any peaks.

The corner frequencies "$W_z$" and "$W_p$" are set within an adjustment circuit by changing the respective values of resisters "$R_1$" and "$R_2$", which correspond to the settings 40 and 42. Conventional laser trimming techniques are preferably used for this purpose. The resister "$R_1$" varies the value of three identical currents "$I_{1a}$", "$I_{1b}$", and "$I_{1c}$" that are replicated by a current mirror 66 for controlling the transconductance gains of respective amplifiers "$g_{m5a}$", "$g_{m5b}$", and "$g_{m4}$". Since the gain "$g_{m5}$" is determined in part by the product of the gains "$g_{m5a}$" and "$g_{m5b}$", the gain "$g_{m5}$" varies as the square of the variation in the gain "$g_{m4}$". This allows variations in the resistance of resister "$R_1$" to set the zero corner frequency "$W_z$" at different values without changing the value of the quality factor "$Q_z$".

The resister "$R_2$" is trimmed by the same technique to vary the value of four other identical currents "$I_{2a}$", "$I_{2b}$", "$I_{2c}$", and "$I_{2d}$" that are replicated by a current mirror 68 The currents "$I_{2a}$", "$I_{2b}$", "$I_{2c}$", and "$I_{2d}$" control the transconductance gains of respective amplifiers "$g_{m5c}$", "$g_{m1}$", "$g_{m2}$", and "$g_{m3}$". The pole corner frequency "$W_p$" is set to a desired value by varying the gains "$g_{m1}$" and "$g_{m2}$". The quality factor "$Q_p$" is unchanged because the product of the gains "$g_{m1}$" and "$g_{m2}$" varies as the square of the gain "$g_{m3}$". In addition, the variation in gain "$g_{m5c}$" cancels the effect of the variation in the gain "$g_{m2}$" on the values of the zero corner frequency "$W_z$" and the quality factor "$Q_z$".

FIG. 5 illustrates the biquadratic filter stage 60 optionally cascaded in series with the identical biquadratic filter stages 62 and 64. The integer "n" is equal to the number of filter stages that are cascaded in series from zero to three. This selection is implemented within an adjustment circuit by a one-of-four selector switch 70 that is set to one of its four positions by optional cuts made across two conductor paths "$S_1$" and "$S_2$" which correspond to the setting 44.

In a first position corresponding to "n" equal to zero, line 72 bypasses all three filter stages 60, 62, and 64, thereby directly interconnecting the audio signals 20 and 26. In the three remaining positions corresponding to "n" equal to 1 through 3, a number of the filter stages corresponding to the integer "n" are connected in series for configuring the state variable filter 24 in different exponential orders. Each filter stage is identical, and the connection of filter stages raises the second order transfer function "H(s)" by the power of "n".

For example, the second position of the selector switch 70, corresponding to the selection of "n" equal to one, opens line 74 and connects only the filter stage 60 between the audio signals 20 and 26 for configuring the state variable filter as a second order filter. In the third position, corresponding to the selection of "n" equal to two, filter stages 60 and 62 are incorporated by line 76 in a fourth order state variable filter. Finally, the fourth position, corresponding to the selection of "n" equal to three, connects all three filter stages 60, 62, and 64 in series along line 78 forming a sixth order state variable filter.

Since all three filter structures 60, 62, and 64 are identical, the corner frequencies "$W_z$" and "$W_p$" of the response curve of the state variable filter 24 are not affected by the changes in filter order. However, the selected filter order equal to twice "n" is effective for controlling the roll-off rate between the two corner frequencies. For example, the roll-off rate at "n" equal to one is 12 decibels per octave, whereas respective roll-off rates of 24 decibels per octave and 36 decibels per octave are achieved at values of "n" equal to two and three.

The three variables "$W_z$" "$W_p$" and "n" which vary the shape of the response curve of the state variable filter 24, are incorporated in a conventional "least squares" algorithm with the maximum volume setting 50 for best fitting the overall frequency response of our hearing aid to prescription requirements. The choice of these variables permits most patterns of hearing loss to be closely matched to the prescription requirements with a single configuration of components. The single channel within which the prescription requirements are met supports a high fidelity response within both high and low ranges of the audible frequency spectrum.

Procedures for fitting our new hearing aid to prescription requirements are greatly simplified. For example, physicians and audiologists can prescribe desired hearing aid amplification characteristics based on audiological assessments without choosing among large arrays of components for achieving these characteristics, or selecting among a limited array of available frequency responses. Instead, a best fit of our hearing aid to prescribed requirements is made during manufacture.

Preferably, the dispensing physicians and audiologists are only required to provide audiological assessments of hearing impairments, and the manufacturer processes these assessments with a known prescription algorithm to determine desired amplification characteristics at predetermined frequencies. For example, a prescription algorithm (NAL-R) proposed by National Acoustic Laboratories of Chatswood, N.S.W., Australia, could be programmed for use by the manufacturer.

However, prior to fitting individual prescriptions, amplification characteristics of the hearing aid components including the microphone 10 and the receiver 54 are determined at the predetermined frequencies. A conventional curve fitting technique is used to match the response curve of the state variable filter 24 to a difference between the collective amplification characteristics of the hearing aid components and the desired amplification characteristics. Laser trimming techniques are used to permanently set the automatic gain control threshold 22, the two corner frequencies 40 and 42, the roll-off rate 44, and the maximum volume 50.

Our hearing aid circuit is preferably implemented on a microelectronic chip that is sized to fit within a shell of an in-the-ear (ITE) hearing aid. The frequency response of the hearing aid is permanently set during manufacture, and only the volume control setting 52 is left for adjustment. The permanent settings are made by laser trimming techniques to allow precise, fast, and programmable adjustments during manufacture. An iterative procedure involving a least squares fit is used to calculate the settings required to best match the frequency response of our hearing aid to prescribed requirements.

Our hearing aid circuit also preferably includes a noise suppression circuit that filters out low-frequency noise. A noise suppression circuit appropriate for this purpose is disclosed in copending application Ser. No. 861,301, filed Mar. 13, 1992, entitled "Aid to Hearing Speech in a Noisy Environment". The disclosure of this copending application is hereby incorporated by reference.

Although only the corner frequencies "$W_z$" and "$W_p$" and the roll-off rate "n" of the filter transfer function are varied in the above example, it would also be possible to vary the quality factors "$Q_z$" and "$Q_p$" of the same or similar transfer function to match more unusual patterns of hearing loss. The required transfer function can also be implemented in a variety of other configurations.

We claim:

1. A hearing aid comprising:
   a microphone for converting sound waves into an audio signal;
   an amplifier for increasing a magnitude of the audio signal;
   a single channel filter for vary the magnitude of the audio signal as function of frequency, said single channel filter having a response curve expressible as a gain in decibels over a domain of audible frequencies;
   a receiver for converting the audio signal into sound waves;
   said response curve exhibiting (a) first and second corner frequencies, (b) a predetermined difference in gain between said first and second corner frequencies, (c) a flat frequency response below said first corner frequency, (d) a sloped frequency response between said first and second corner frequencies, and (e) a flat frequency response above said second corner frequency;
   an adjustment circuit for setting said first and second corner frequencies and said difference in gain between the first and second corner frequencies; and
   said difference in gain "G" between the first and second corner frequencies being determined in accordance with the following equation:

$$G = 20 \log [(W_z^2/W_p^2)^n]$$

where "$W_z$" is said first corner frequency, "$W_p$" is said second corner frequency, and "n" is an integer.

2. The hearing aid of claim 1 in which said difference in gain "G" between the first and second corner frequencies is limited to between −45 decibels 9 decibels.

3. The hearing aid of claim 1 in which said single channel filter is a variable order filter, and said integer "n" is equal to one-half of a selected filter order.

4. The hearing aid of claim 3 in which said single channel filter includes at least two biquadratic filter stages arranged to be cascaded in series, and said integer "n" is equal to the number of biquadratic filter stages that are cascaded in series.

5. The hearing aid of claim 6 in which each of said biquadratic filter stages exhibits a general transfer function H(s) as follows:

$$H(s) = \left[ \frac{s^2 + (W_z/Q_z) + W_z^2}{s^2 + (W_p/Q_p) + W_p^2} \right]$$

where "s" is a complex frequency, "$W_z$" is said first corner frequency in angular measure, "$W_p$" is said second corner frequency in angular measure, and "$Q_z$" and "$Q_p$" are quality factors.

6. The hearing aid of claim 5 in which the corner frequency "$W_p$" is limited to frequencies between 1250 hertz and 2500 hertz.

7. The hearing aid of claim 5 in which the quality factors "$Q_z$" and "$Q_p$" are equal.

8. The hearing aid of claim 5 in which the cascaded biquadratic filter stages are identical.

9. The hearing aid of claim 8 in which a roll-off rate between the two corner frequencies "$W_z$" and "$W_p$" is determined by said integer "n" number of biquadratic filter stages cascaded in series.

10. A hearing aid circuit having a permanently adjustable frequency response comprising:
    an input circuit from a microphone;
    an output circuit to a receiver;

a plurality of filter stages in series;

each of said filter stages exhibiting a response curve having two corner frequencies;

said response curve being defined by a transfer function in which one of said two corner frequencies is a pole and the other of said two corner frequencies is a zero;

a switching circuit having a first position for connecting only one of said filter stages between said input and output circuits and a second position for connecting more than one of said filter stages in series between said input and output circuits;

an adjustment circuit for permanently setting said two corner frequencies and said switching circuit to one of said two positions; and said plurality of filter stages in series including three filter stages having the same two corner frequencies.

11. The circuit of claim 10 in which said second position of the switching circuit connects two of said three filter stages in series between said input and output circuits.

12. The circuit of claim 11 in which said switching circuit includes a third position for connecting all three of said filter stages in series between said input and output circuits.

13. The circuit of claim 12 in which said adjustment circuit provides for permanently setting said switching circuit to one of said three positions.

14. A hearing aid circuit having a permanently adjustable frequency response comprising:

an input circuit from a microphone;

an output circuit to a receiver;

a plurality of filter stages;

each of said filter stages exhibiting a response curve having two corner frequencies;

said response curve being defined by a transfer function in which one of said two corner frequencies is a pole and the other of said two corner frequencies is a zero;

a switching circuit having a first position for connecting only one of said filter stages between said input and output circuits and a second position for connecting more than one of said filter stages in series between said input and output circuits;

an adjustment circuit for permanently setting said two corner frequencies and said switching circuit to one of said two positions; and a combined response curve of said filter stages exhibiting a flat frequency response below one of said two corner frequencies, a sloped frequency response between said two corner frequencies, and a flat frequency response above the other of said two corner frequencies.

15. The circuit of claim 14 in which said combined response curve exhibits a roll-off rate between said two corner frequencies is determined by the number of filter stages connected in series between the input and output circuits.

16. The circuit of claim 15 in which each of said stages is a biquadratic filter.

17. The circuit of claim 16 in which said combined response curve exhibits a predetermined difference in gain "G" in decibels between said two corner frequencies in accordance with the following equation:

$$G = 20 \log [(W_z^2/W_p^2)^n]$$

where "$W_z$" is one of said corner frequencies, "$W_p$" is the other of said corner frequencies, and "n" is the number of filter stages connected in series between the input and output circuits.

18. A method of matching a frequency response of a hearing aid to prescribed amplification characteristics at predetermined frequencies including the steps of:

determining collective amplification characteristics of device components, including a microphone and a receiver, at the predetermined frequencies;

fitting a single channel filter response curve as a function of frequency to a difference between the collective amplification characteristics and the prescribed amplification characteristics for a given hearing loss;

permanently setting a first corner frequency of the filter response curve below which the response curve exhibits a flat frequency response;

permanently setting a second corner frequency of the filter response curve above which the response curve exhibits a flat frequency response;

permanently setting a predetermined difference in gain between said first and second corner frequencies; and making the single channel filter from a plurality of filter stages that can be cascaded in series, and said step of permanently setting the predetermined difference in gain including cascading a predetermined number of the filter stages in series.

19. The method of claim 18 in which the permanent settings for the corner frequencies are made by a programmable trimming technique.

* * * * *